US012676204B2

(12) United States Patent
Jung et al.

(10) Patent No.: US 12,676,204 B2
(45) Date of Patent: Jul. 7, 2026

(54) MEMORY SYSTEM AND OPERATION METHOD OF MEMORY SYSTEM

(71) Applicant: SK hynix Inc., Gyeonggi-do (KR)

(72) Inventors: Chul Moon Jung, Gyeonggi-do (KR);
Uk Song Kang, Gyeonggi-do (KR);
Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 141 days.

(21) Appl. No.: 18/632,306

(22) Filed: Apr. 11, 2024

(65) Prior Publication Data

US 2024/0257894 A1 Aug. 1, 2024

Related U.S. Application Data

(62) Division of application No. 17/549,564, filed on Dec. 13, 2021, now Pat. No. 11,990,198.

(60) Provisional application No. 63/129,074, filed on Dec. 22, 2020.

(30) Foreign Application Priority Data

Nov. 24, 2021 (KR) ........................ 10-2021-0163743

(51) Int. Cl.
*G11C 29/42* (2006.01)
*G11C 17/16* (2006.01)
*G11C 29/18* (2006.01)
*G11C 29/44* (2006.01)
*G11C 29/12* (2006.01)

(52) U.S. Cl.
CPC .............. *G11C 29/42* (2013.01); *G11C 17/16* (2013.01); *G11C 29/18* (2013.01); *G11C 29/4401* (2013.01); *G11C 2029/1202* (2013.01)

(58) Field of Classification Search
CPC ......... G11C 29/42; G11C 17/16; G11C 29/18; G11C 29/4401; G11C 2029/1202
See application file for complete search history.

(56) References Cited

U.S. PATENT DOCUMENTS

| | | | | |
|---|---|---|---|---|
| 2009/0323942 A1* | 12/2009 | Sharon | ............... | G11C 16/3427 |
| | | | | 380/28 |
| 2016/0139833 A1* | 5/2016 | Chang | ................. | G11C 11/4076 |
| | | | | 711/105 |
| 2019/0228815 A1* | 7/2019 | Morohashi | ........... | G11C 16/349 |
| 2021/0382638 A1* | 12/2021 | Anderson | ............. | G06F 3/0632 |
| 2023/0065593 A1 | 3/2023 | Boehm et al. | | |

OTHER PUBLICATIONS

Notice of Allowance for U.S. Appl. No. 18/632,323 issued by the USPTO on Oct. 14, 2025.

* cited by examiner

*Primary Examiner* — Han Yang
(74) *Attorney, Agent, or Firm* — IP & T GROUP LLP

(57) ABSTRACT

A memory system includes: an address scrambler suitable for scrambling an address based on a scrambling rule to generate a scrambled address; a memory core including a plurality of memory cells and suitable for storing data in memory cells designated by the scrambled address; and a scramble control circuit suitable for changing the scrambling rule in response to satisfaction of an attack condition.

6 Claims, 4 Drawing Sheets

Figure 2:
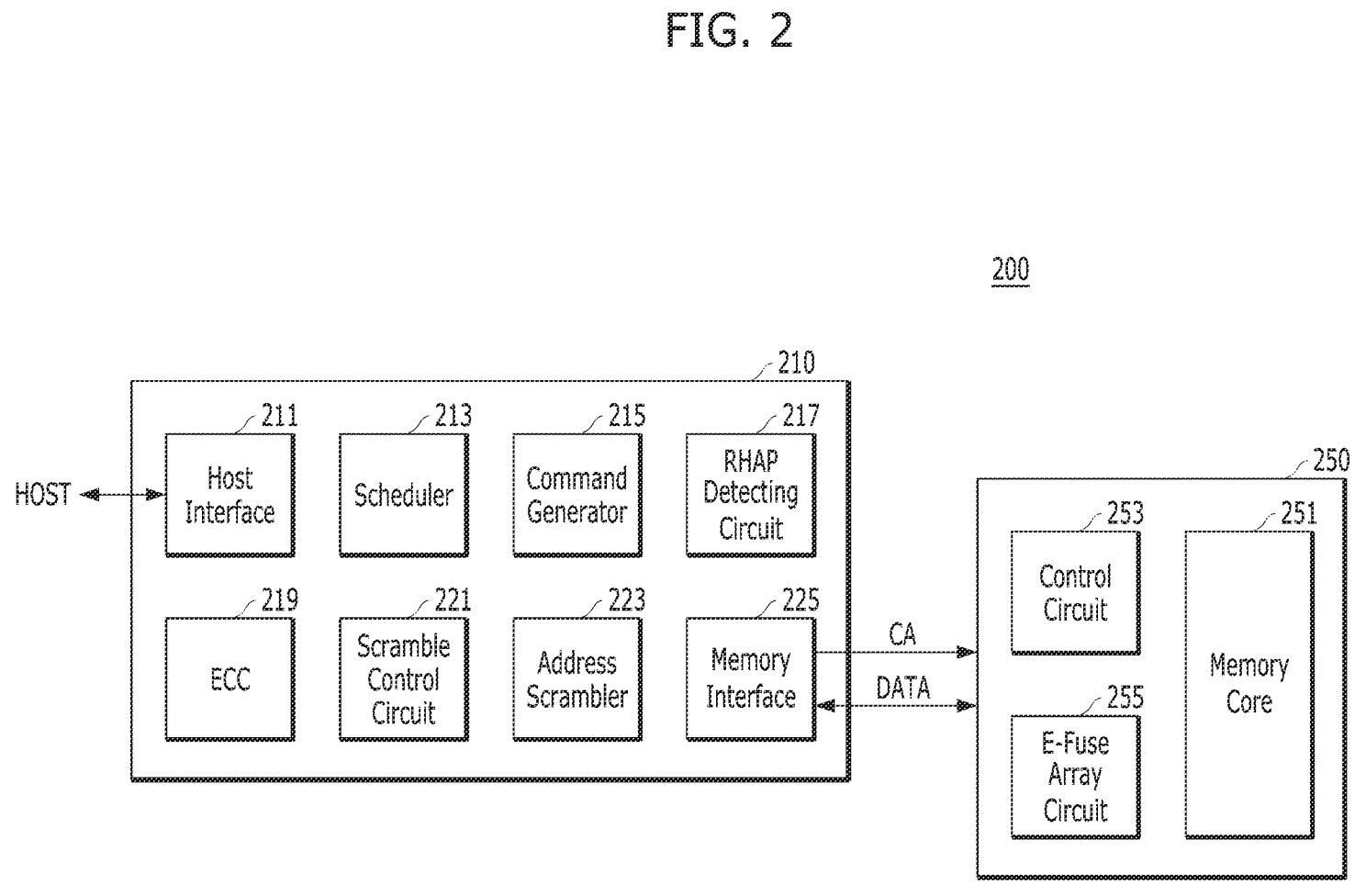

211 Host Interface

213 Scheduler

215 Command Generator

217 RHAP Detecting Circuit

219 ECC

221 Scramble Control Circuit

223 Address Scrambler

225 Memory Interface

HOST

CA

DATA

250

251 Memory Core

253 Control Circuit

255 E-Fuse Array Circuit

Figure 3:
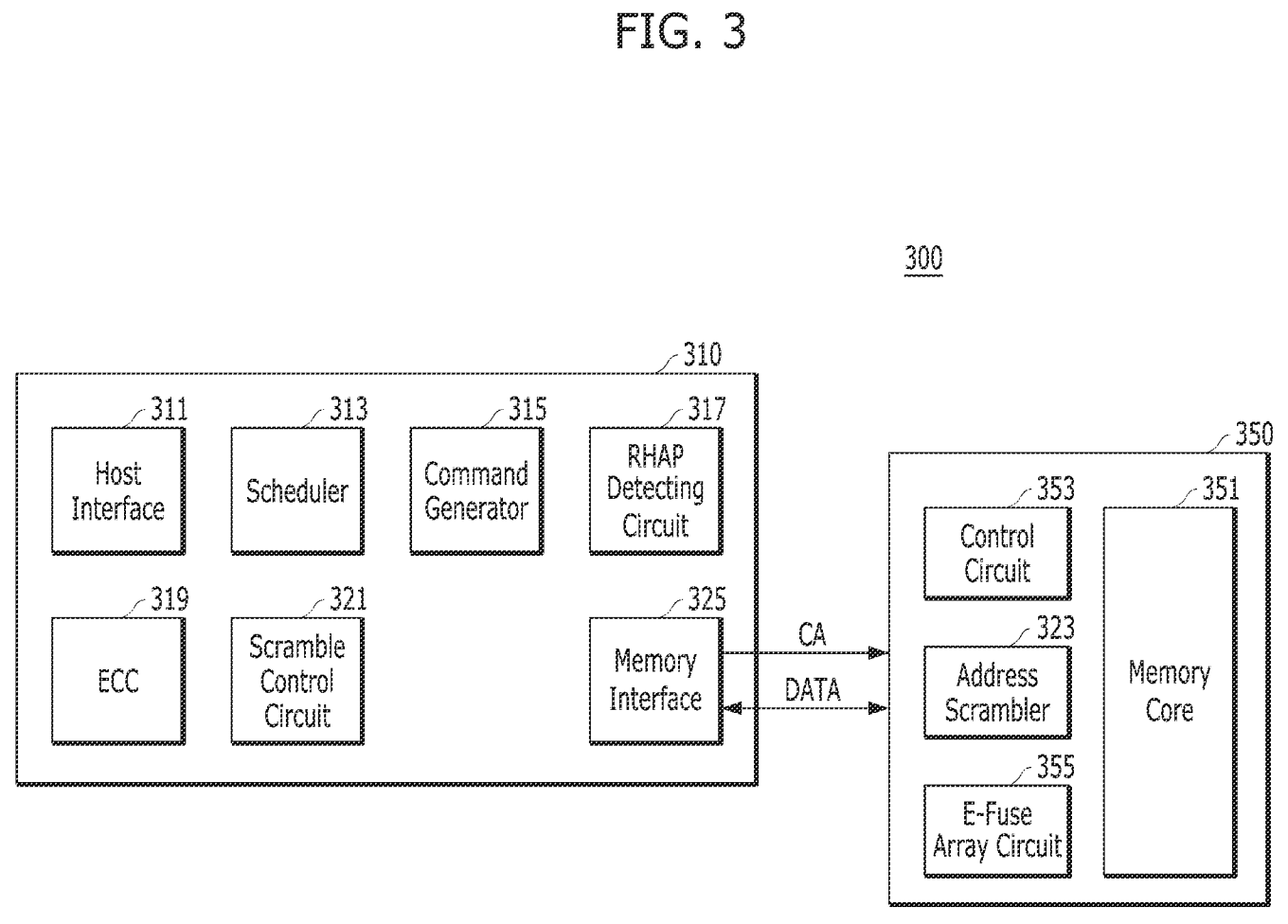

311 Host Interface

313 Scheduler

315 Command Generator

317 RHAP Detecting Circuit

319 ECC

321 Scramble Control Circuit

325 Memory Interface

CA

DATA

350

351 Memory Core

353 Control Circuit

323 Address Scrambler

355 E-Fuse Array Circuit

FIG. 4

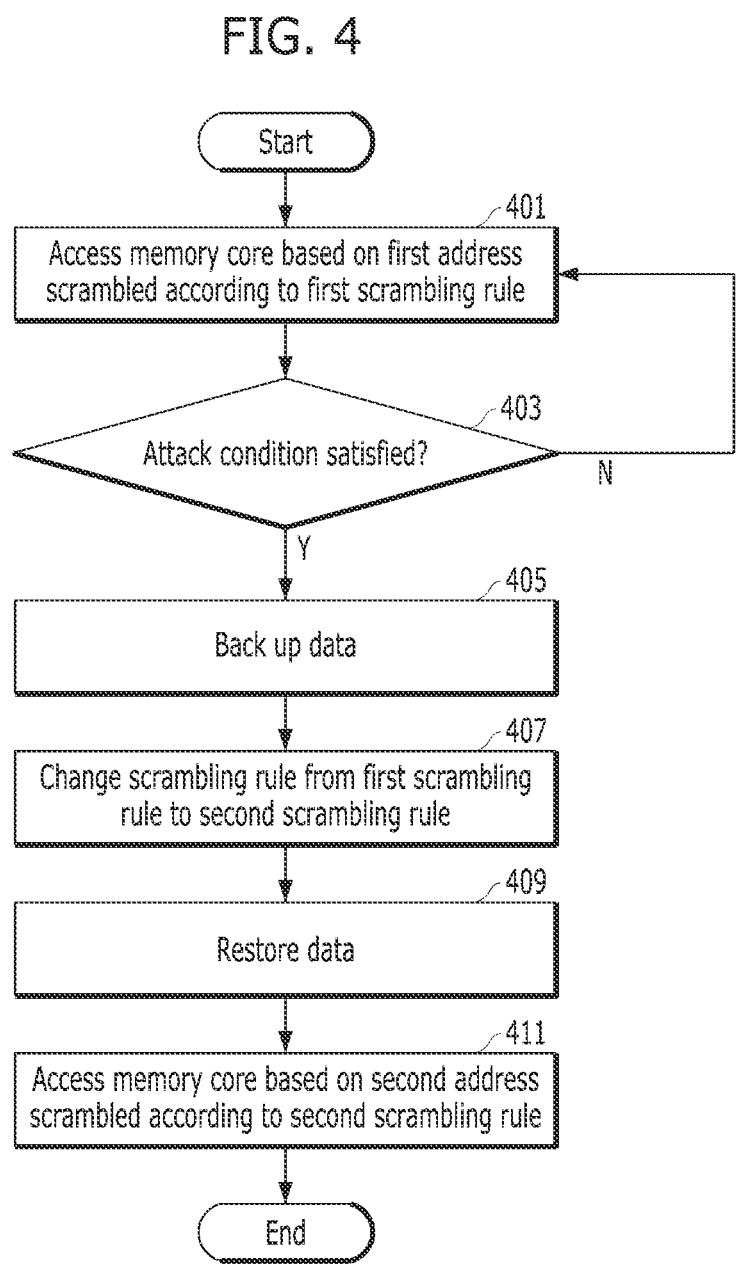

Start

401

Access memory core based on first address scrambled according to first scrambling rule

403

Attack condition satisfied?    N

Y

405

Back up data

407

Change scrambling rule from first scrambling rule to second scrambling rule

409

Restore data

411

Access memory core based on second address scrambled according to second scrambling rule End

MEMORY SYSTEM AND OPERATION METHOD OF MEMORY SYSTEM

CROSS-REFERENCE TO RELATED APPLICATIONS

This application is a divisional of U.S. patent application Ser. No. 17/549,564 filed on Dec. 13, 2021, which claims priority to U.S. Provisional Patent Application No. 63/129,074, filed on Dec. 22, 2020, and Korean Patent Application No. 10-2021-0163743, filed on Nov. 24, 2021, which are incorporated herein by reference in its entirety.

BACKGROUND

1. Field

Various embodiments of the present invention relate to a memory system.

2. Description of the Related Art

As the degree of integration of a memory increases, the spacing between a plurality of word lines included in the memory decreases. As the spacing between word lines decreases, the coupling effect between the neighboring word lines increases.

Moreover, whenever data is input or output to or from a memory cell, a word line toggles between an active state and an inactive state. As the coupling effect between the neighboring word lines increases, the data in the memory cell coupled to a word line which is disposed adjacent to a frequently activated word line may be damaged. This phenomenon is referred to as Row Hammering. Since the data of a memory cell is damaged before the memory cell is refreshed due to word line disturbance, there may be an issue.

FIG. 1 is a schematic diagram describing row hammering and it shows a portion of a cell array included in a memory.

In FIG. 1, 'WLL' may correspond to a word line (row line) with a large number of activations, and 'WLL−1' and 'WLL+1' may be word lines disposed adjacent to 'WLL', that is, word lines disposed adjacent to the word line with a large number of activations. Also, 'CL' may indicate a memory cell that is coupled to the 'WLL', 'CL−1' may indicate a memory cell that is coupled to the 'WLL−1', and 'CL+1' may indicate a memory cell that is coupled to the 'WLL+1'. Each memory cell may include a cell transistor TL, TL−1, and TL+1 and a cell capacitor CAPL, CAPL−1, and CAPL+1.

When 'WLL' is activated or deactivated in FIG. 1, the voltages of 'WLL−1' and 'WLL+1' may rise or fall due to the coupling effect occurring between the 'WLL' and the 'WLL−1' and 'WLL+1', which also affects the amount of charges in the cell capacitors CL−1 and CL+1. Therefore, when the 'WLL' is frequently activated and the 'WLL' toggles between an activated state and a deactivated state, the change in the amount of charges stored in the cell capacitors CAPL−1 and CAPL+1 that are included in the 'CL−1' and the 'CL+1' may increase and the data in the memory cell may be deteriorated.

Additionally, the electromagnetic wave generated when the word line toggles between the activated state and the deactivated state may damage the data by introducing electrons into the cell capacitor of the memory cell coupled to a neighboring word line, or leaking electrons from the cell capacitor.

As a method for solving the problem of row hammering, a method of detecting a row (word line) that has been activated multiple times and refreshing the neighboring rows of the row that has been activated multiple times is mainly used.

SUMMARY

Embodiments of the present invention are directed to a technique for increasing the defense ability of a memory system against row hammering attacks.

In accordance with an embodiment of the present invention, a memory system includes: an address scrambler suitable for scrambling an address based on a scrambling rule to generate a scrambled address; a memory core including a plurality of memory cells and suitable for storing data in memory cells designated by the scrambled address; and a scramble control circuit suitable for changing the scrambling rule in response to satisfaction of an attack condition.

In accordance with another embodiment of the present invention, a method for operating a memory system includes: scrambling an address according to a first scrambling rule to produce a first scrambled address; accessing a memory core based on the first scrambled address; determining that an attack condition for the memory core is satisfied; changing the first scrambling rule into a second scrambling rule; scrambling the address according to the second scrambling rule to produce a second scrambled address; and accessing the memory core based on the second scrambled address.

In accordance with another embodiment of the present invention, a method for operating a controller includes: detecting row hammering on a memory core within a memory device; changing a scrambling rule upon the detecting; and controlling the memory device to access the memory core according to an address scrambled by the changed scrambling rule.

BRIEF DESCRIPTION OF THE DRAWINGS

FIG. 2 is a block diagram illustrating a memory system in accordance with an embodiment of the present invention.

FIG. 3 is a block diagram illustrating a memory system in accordance with another embodiment of the present invention.

FIG. 4 is a flowchart describing an operation of the memory system shown in FIG. 2 in accordance with an embodiment of the present invention.

DETAILED DESCRIPTION

Figure 1:
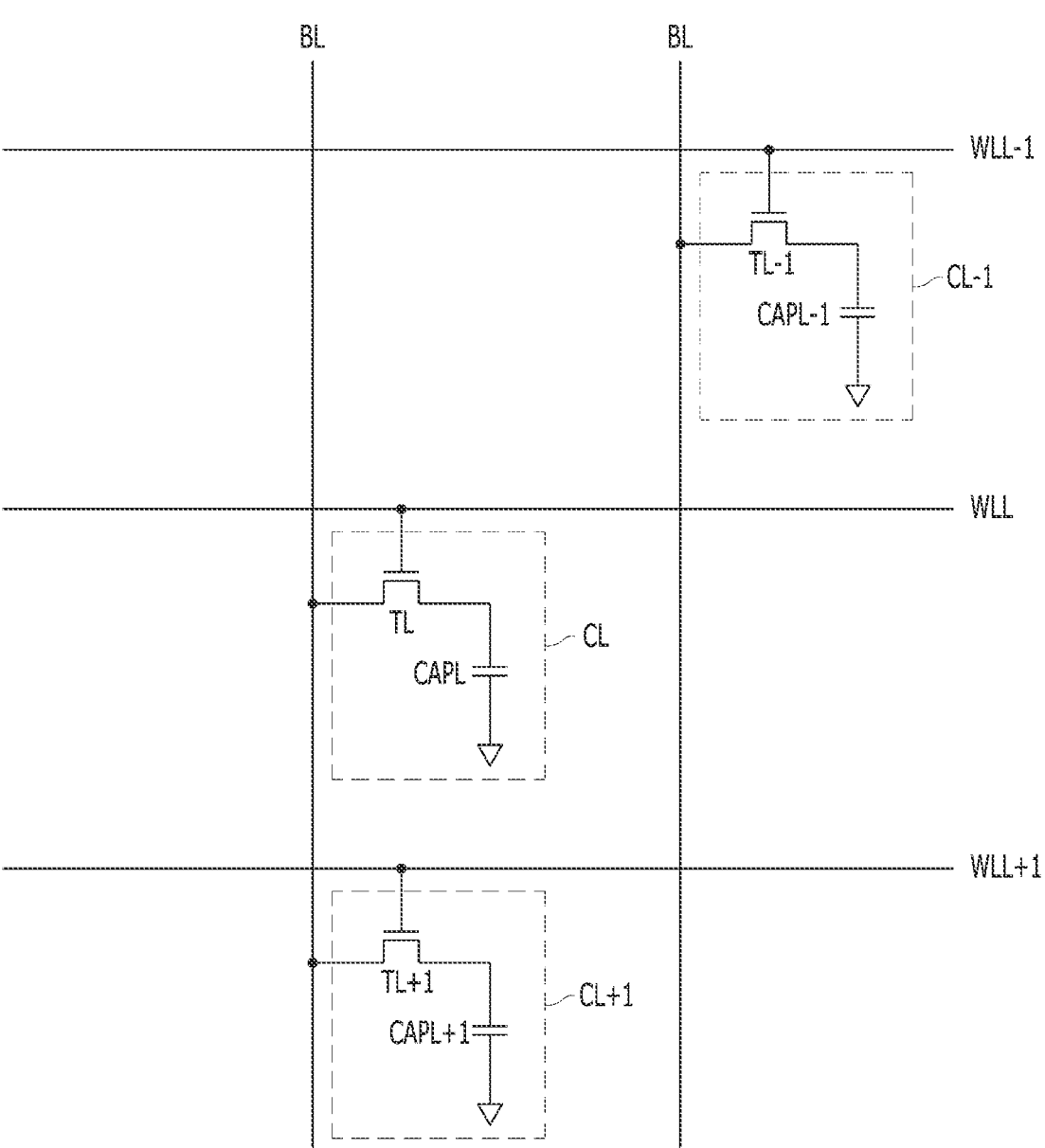
FIG. 1 is a schematic diagram describing row hammering.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

FIG. 2 is a block diagram illustrating a memory system 200 in accordance with an embodiment of the present invention.

Referring to FIG. 2, the memory system 200 may include a memory controller 210 and a memory 250.

The memory controller 210 may control the operation of the memory 250 according to a request from a host HOST. The host HOST may include a Central Processing Unit (CPU), a Graphic Processing Unit (GPU), an Application Processor (AP), and the like. The memory controller 210 may include a host interface 211, a scheduler 213, a command generator 215, a row hammer attack pattern detecting circuit 217, an error correction circuit 219, a scramble control circuit 221, an address scrambler 223, and a memory interface 225. The memory controller 210 may be included in a CPU, GPU, AP and the like. In this case, the host HOST may indicate the constituent elements other than the memory controller 210 in these structures. For example, when the memory controller 210 is included in a CPU, the host HOST of the figure may represent the remaining constituent elements of the CPU except for the memory controller 210.

The host interface 211 may be provided for an interface between the memory controller 210 and the host HOST.

The scheduler 213 may determine the order of requests to be commanded to the memory 250 among the requests from the host HOST. The scheduler 213 may change the order of the requests received from the host HOST and the order of the operations to be commanded to the memory 250 in order to improve the performance of the memory 250. For example, even though the host HOST requests the memory 250 to perform a read operation first and then to perform a write operation later, the order of the operations may be adjusted such that a write operation is performed before a read operation.

The command generator 215 may generate a command to be applied to the memory 250 according to the order of the operations determined by the scheduler 213.

The row hammer attack pattern detecting circuit 217 may detect a row hammer attack pattern with respect to a memory core 251 of the memory 250. The row hammer attack pattern detecting circuit 217 may count the number of active operations of the rows of the memory core 251 and classify the rows that have been excessively activated into hammered rows (which are rows highly likely to lose data). In the memory core 251, since the rows disposed adjacent to the hammered row have a high possibility of data loss, the scheduler 213 may schedule a refresh operation for the rows adjacent to the hammered row. This refresh operation is also called a smart refresh operation.

The error correction circuit 219 may detect and correct an error in the data stored in the memory 250. The error correction circuit 219 may generate an error correction code ECC based on the data to be written into the memory 250 during a write operation of the memory 250. The error correction code generated by the error correction circuit 219 may be stored in the memory 250 together with the write data. The error correction circuit 219 may detect an error in the data read from the memory 250 based on the error correction code read from the memory 250 during a read operation of the memory 250, and when an error is detected, the error correction circuit 219 may correct the error.

The address scrambler 223 may scramble an address based on a predetermined scrambling rule to generate a scrambled address. The memory 250 may be accessed by the scrambled address generated by the address scrambler 223.

The scramble control circuit 221 may change the scrambling rule of the address scrambler 223 whenever an attack condition is satisfied. Here, the satisfaction of the attack condition may mean confirming presence of the condition under which it may be determined that there is a hacker's row hammer attack. Whether the attack condition is satisfied or not may be determined by using the row hammer attack pattern detecting circuit 217 and the error correction circuit 219. For example, when the following conditions (1) and (2) are satisfied, it may be determined that the attack condition is satisfied.

(1) When the row hammer attack pattern detecting circuit 217 detects a row hammer attack pattern for one row, for example, when one row is activated excessively many times and selected as a hammered row, it may be determined that a row hammer attack pattern for the corresponding row is detected.

(2) When the error correction circuit 219 detects an error which is equal to or greater than a threshold value in the neighboring rows of the hammered row, that is, when a read operation is performed and an error which is equal to or greater than the threshold value is detected in the neighboring rows of the hammered row, it may be determined that a hacker's row hammer attack is somewhat successful and the attack condition is satisfied.

A hacker may perform a row hammer attack on a memory region where a kernel, which is important security information, is stored to distort data and to snatch the administrator-level authority of the computer system. Since the hacker is originally not aware of the location where the kernel is stored in the memory 250, the hacker finds out where the kernel is by going through trial and error of attacking various regions through the row hammer attack. The scramble control circuit 221 may make it impossible for the hacker to find out the location where the kernel is stored by changing the scrambling rule of the address scrambler 223 whenever an attack condition of the hacker is detected. That is, it may effectively defend a row hammer attack from a hacker.

The memory interface 225 may be provided for an interface between the memory controller 210 and the memory 250. Through the memory interface 225, a command and an address CA may be transferred from the memory controller 210 to the memory 250 and data DATA may be transferred/received. The memory interface 225 may also be referred to as a PHY interface.

The memory 250 may perform an operation commanded by the memory controller 210. The memory 250 may be a memory requiring a refresh operation. For example, the memory 250 may be a DRAM or another type of a memory requiring a refresh operation.

The memory 250 may include a memory core 251, a control circuit 253, and an e-fuse array circuit 255.

The control circuit 253 may control the overall operation of the memory 250. The control circuit 253 may control the internal constituent elements of the memory 250 so that the memory 250 can perform the operations indicated by the command and the address CA, for example, an active operation, a precharge operation, a read operation, a write operation, and a refresh operation.

The memory core 251 may include a plurality of memory cells that are arranged in a plurality of rows and a plurality of columns. Also, the memory core 251 may include circuits for writing data reading data to and from the memory cells.

The e-fuse array circuit 255 includes a plurality of e-fuses, and may store information related to repair of the memory 250 and information related to various settings of the memory 250. The information stored in the e-fuse array circuit 255 may be continuously maintained even when the power supply to the memory 250 is turned off. The scramble control circuit 221 may store information related to the scrambling rule used by the address scrambler 223 in the e-fuse array circuit 255 to cope with a case in which the power supply to the memory system 200 is turned off.

FIG. 3 is a block diagram illustrating a memory system 300 in accordance with another embodiment of the present invention.

Referring to FIG. 3, the memory system 300 may include a memory controller 310 and a memory 350.

The memory controller 310 may include a host interface 311, a scheduler 313, a command generator 315, a row hammer attack pattern detecting circuit 317, an error correction circuit 319, a scramble control circuit 321, and a memory interface 325. The constituent elements 311, 313, 315, 317, 319, 321, and 325 of the memory controller 310 shown in FIG. 3 may be designed the same as the constituent elements 211, 213, 215, 217, 219, 221 and 225 of the memory controller 210 shown in FIG. 2.

The memory controller 310 may have a structure in which the address scrambler 223 is omitted from the structure of the memory controller 210. This is because, in the embodiment of FIG. 3, the address scrambler 323 is included not in the memory controller 310 but in the memory 350. The memory controller 310 may transfer an unscrambled address to the memory 350 through the memory interface 225, and the address scrambling operation may be performed by the address scrambler 323 of the memory 350. The scramble control circuit 321 may change the scrambling rule of the address scrambler 323 of the memory 350 through the memory interface 325.

The memory 350 may include a memory core 351, a control circuit 353, an e-fuse array circuit 355, and the address scrambler 323. The constituent elements 351, 353, and 355 of the memory 350 shown in FIG. 3 may be designed the same as the constituent elements 251, 353, and 355 of the memory 250 shown in FIG. 2.

The address scrambler 323 of the memory 350 may scramble the address transferred from the memory controller 310, and the address scrambled by the address scrambler 323 may be used to access the memory core 351.

Unlike the memory system 200 shown in FIG. 2, the address scrambler 323 may be included in the memory 350 in the memory system 300 shown in FIG. 3. A described above, the constituent elements of the memory system 300 may be included in either the memory controller 310 or the memory 350. For example, some or all of the row hammer attack pattern detecting circuit 317, the error correction circuit 319, and the scramble control circuit 321 may not be included in the memory controller 310 but may be included in the memory 350.

FIG. 4 is a flowchart describing an operation of the memory system 200 shown in FIG. 2 in accordance with an embodiment of the present invention. The memory system 300 shown in FIG. 3 may operate in the same manner as shown in FIG. 4.

Referring to FIG. 4, first, the memory core 251 may be accessed based on an address scrambled according to a first scrambling rule in operation 401. When the memory controller 210 accesses the memory 250, the address scrambler 223 may scramble the address according to the first scrambling rule, and the scrambled address may be transferred to the memory 250 so that the memory core 251 may be accessed.

During the operation of the memory system 200, an attack condition for the memory core 251 may be satisfied (Y in the operation 403). The attack condition may be determined to be satisfied when one row is selected as a hammered row because it is activated too many times and when an error equal to or greater than a threshold value is detected in the neighboring rows of the hammered row. The scramble control circuit 221 may determine to change the scrambling rule of the address scrambler 223 in response to the satisfaction of the attack condition.

After the attack condition is satisfied, the data of the memory core 251 may be backed up in operation 405. When the scrambling rule of the address scrambler 223 is changed, the address mapping of the memory core 251 may be changed. This is why the data of the memory core 251 are backed up. The memory controller 210 may transfer an interrupt signal to the host HOST before backing up the data of the memory core 251 to temporarily stop the operation of the host HOST. The data of the memory core 251 may be backed up in another memory (not shown) or storage inside the memory system 200.

After the data back-up is completed, the scramble control circuit 221 may change the scrambling rule of the address scrambler 223 from the first scrambling rule to a second scrambling rule which is different from the first scrambling rule in operation 407. When the scrambling rule is changed, it may be very difficult for a hacker to track an area in the memory core 251 where important security data are stored. Address scrambling may be performed based on the Pseudo Random Binary Sequence (PRBS). In the process of scrambling the address based on the PRBS between the first scrambling rule and the second scrambling rule, the bits of the address to be scrambled and the order of the PRBS may be different from each other.

After the scrambling rule is changed, the back-up data may be restored back into the memory core 251 in operation 409.

Subsequently, the memory core 251 may be accessed based on the address which is scrambled according to the second scrambling rule in operation 411. When the memory controller 210 accesses the memory 250, the address scrambler 233 may scramble the address according to the second scrambling rule, and the scrambled address may be transferred to the memory 250 so that the memory core 251 may be accessed. Also, the scramble control circuit 221 may store the information related to the changed scrambling rule in the e-fuse array circuit 255 of the memory 250.

FIG. 4 illustrates backing up the data of the memory core 251 before the scrambling rule is changed and restoring the data of the memory core 251 after the scrambling rule is changed. However, in a case that the data written before the changed of the scrambling rule and the data written after the changed of the scrambling rule can be traced, since it is possible to access the data stored based on the previous scrambling rule even though the scrambling rule is changed, the process of backing up and restoring the data may be omitted.

According to the embodiment of the present invention, the defense ability of a memory system against row hammering attacks may be increased.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. An operating method of a controller of a memory system, the operating method comprising:

detecting a row hammer attack pattern for one row of memory cells within a memory device;

determining an error equal to or greater than a threshold value which occurs in neighboring rows of the one row;

changing a scrambling pattern upon a determining result; and controlling the memory device to access the memory core according to an address scrambled by the changed scrambling pattern.

2. The operating method of claim 1, further comprising controlling the memory device to:

back up data stored in the memory core before the changing; and restore the backed-up data back into the memory core after the changing.

3. The operating method of claim 1, wherein the detecting, the determining, and the changing are performed by the controller within the memory system, and wherein the controlling is performed by the memory device within the memory system.

4. The operating method of claim 1, wherein the changing the scrambling pattern is performed by an address scrambler.

5. The operating method of claim 4, wherein the address scrambler is located in the controller within the memory system.

6. The operating method of claim 4, wherein the address scrambler is located in the memory core within the memory system.

* * * * *